United States Patent
Kimura et al.

[11] Patent Number: 6,085,833
[45] Date of Patent: Jul. 11, 2000

[54] HEAT SINK

[75] Inventors: Naoki Kimura; Jun Niekawa; Osamu Kodachi, all of Tokyo, Japan

[73] Assignee: Furukawa Electric Co., Ltd., Tokyo, Japan

[21] Appl. No.: 08/871,150

[22] Filed: Jun. 9, 1997

[30]  Foreign Application Priority Data

Jun. 6, 1996 [JP] Japan .................................. 8-166867

[51] Int. Cl.⁷ .................................................... H05K 7/20
[52] U.S. Cl. ........................ 165/185; 165/80.3; 174/16.3; 257/722; 361/704
[58] Field of Search ................... 165/80.3, 185; 174/16.3; 257/722; 361/704, 707, 710

[56]  References Cited

U.S. PATENT DOCUMENTS

| | | | |
|---|---|---|---|
| 3,216,496 | 11/1965 | Katz | 165/80.3 X |
| 3,566,959 | 3/1971 | Koltuniak . | |
| 4,270,604 | 6/1981 | Nakamura | 165/185 |
| 4,764,847 | 8/1988 | Eisenblatter et al. | 165/185 X |
| 5,199,164 | 4/1993 | Kim et al. | 165/185 X |
| 5,272,375 | 12/1993 | Belopolsky | 361/704 X |
| 5,272,599 | 12/1993 | Koenen | 361/710 |
| 5,355,281 | 10/1994 | Adelmann et al. | 361/707 |
| 5,421,406 | 6/1995 | Furusawa et al. | 165/185 |
| 5,528,456 | 6/1996 | Takahashi | 361/704 |
| 5,675,474 | 10/1997 | Nagase et al. | 361/704 |

FOREIGN PATENT DOCUMENTS

| | | | |
|---|---|---|---|
| 2053664 | 10/1970 | Germany . | |
| 47895 | 2/1990 | Japan | 361/704 |
| 267547 | 9/1992 | Japan | 257/722 |
| 304383 | 11/1993 | Japan . | |
| 304384 | 11/1993 | Japan . | |
| 85480 | 3/1994 | Japan . | |

*Primary Examiner*—Leonard Leo
*Attorney, Agent, or Firm*—Thorp Reed & Armstrong

[57]  ABSTRACT

There is provided a heat sink having excellent heat dissipation characteristics and mechanical reliability, which is used for motors for electric vehicles, control circuits therefor, internal combustion engines, general power control units, general motors, general semiconductors (CPUs, power modules, etc.), optical semiconductors and various electronic components, etc. The heat sink is configured so that an aluminum alloy layer is formed on at least one side or on both sides of a metallic plate shaped body and fins are formed on the aluminum alloy layer. Because the fins are formed on the aluminum alloy layer provided on the metallic plate shaped body, satisfactory thermal diffusion is effected in the metallic plate shaped body, and the thermal resistance between the metallic plate shaped body and the fin is low, so that the heat radiating effect is high, and the heat sink can be made small. Also, excellent and stable heat dissipation can be achieved for a long period of time.

17 Claims, 2 Drawing Sheets

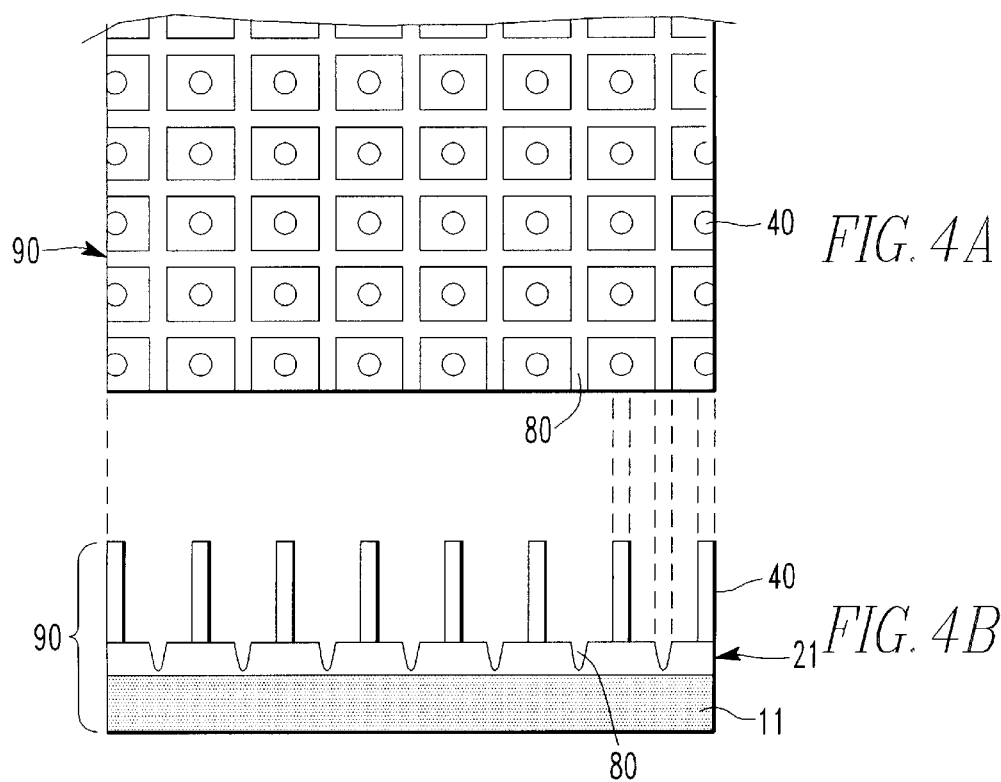
*FIG. 4A*
*FIG. 4B*
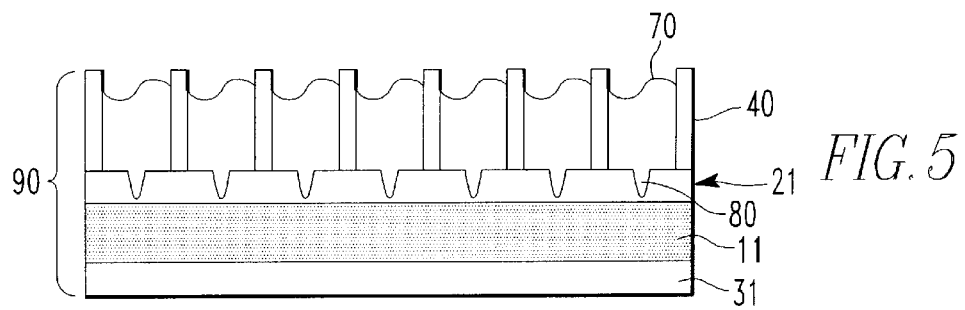
*FIG. 5*
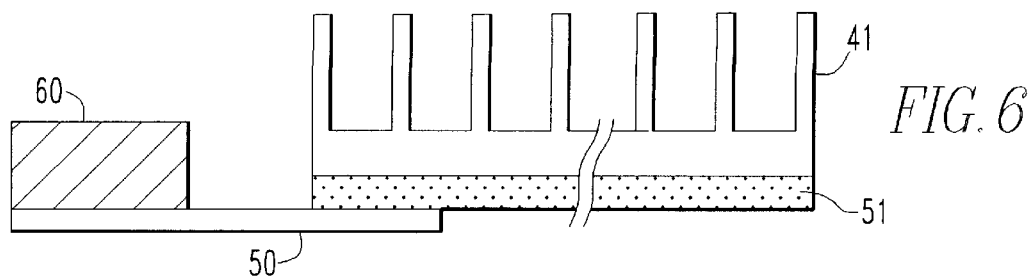
*FIG. 6*

HEAT SINK

BACKGROUND OF THE INVENTION

1. Field of the Invention

The present invention relates to a heat sink having excellent heat dissipation by convection, which is used for heat generating parts applied to motors for electric vehicles, control circuits therefor, internal combustion engines, general power control units, various types of motors, various types of semiconductors (CPUs, power modules, etc.), optical semiconductors, and other various electric and electronic components, etc.

2. Description of Related Art

Effectively cooling heat generating parts of the above-mentioned electric and electronic components, etc. is an important problem to be solved when using equipment. Also, a cooling system for the heat generating parts is required to be small in size.

Conventionally, the heat generating parts of the electric and electronic components, etc. have been cooled by thermally connecting a heat sink of aluminum or aluminum alloy to the heat generating part. However, because aluminum or aluminum alloy (hereinafter both are described as aluminum alloy) has a low thermal conductivity, heat diffusion by the heat sink is insufficient. Thus, a sufficient cooling effect cannot be obtained. This problem has so far been solved by making a large-sized heat sink.

For example, U.S. Pat. No. 3,566,959 discloses a heat sink of an extruded section provided with many fins for a semiconductor rectifier assembly.

However, the heat generating parts have been made small and the calorific value has increased, hence a heat sink having higher performance and smaller size has been in strong demand.

SUMMARY OF THE INVENTION

Accordingly, the object of the present invention is to provide a heat sink having excellent heat dissipation characteristics and mechanical reliability.

The present invention provides a heat sink comprising a base, which is composed of a metallic plate shaped body having a coefficient of thermal conductivity higher than that of aluminum, a layer of aluminum or aluminum alloy metal bonded on at least one side or on both sides of the said metallic plate shaped body, and fins for heat dissipation by convection which are metallic bonded with the said layer of aluminum or aluminum alloy.

The metallic bonding between the metallic plate shaped body and the layer of aluminum or aluminum alloy can be made by one of the methods of brazing, soldering, diffused bonding, welding or roll-cladding.

The metallic bonding between the layer of aluminum or aluminum alloy and the fins for heat dissipation, can be made by one of the methods of brazing, soldering, diffused bonding or welding because the metallic bonding can maintain a high and stable heat transfer between the metallic plate shaped body and the layer of aluminum or aluminum alloy, and between the layer of aluminum or aluminum alloy and the fins for heat dissipation.

The aforementioned metallic bonding contributes to a stable and high heat transfer between the metallic plate shaped body and the layer of aluminum alloy and between the layer of aluminum alloy and the fins.

Also, it is preferable that the thickness of the aluminum alloy layer be 2 to 50% of the thickness of the heat conductive plate shaped body. Further, grooves for promoting heat transfer can be formed in the aluminum alloy layer covering the surface of the metallic plate shaped body.

Support members for supporting the fins can be provided among the fins formed on the aluminum alloy layer. Also, a plurality of heat generating parts can be connected to this heat sink.

A cross section exposed to the outside of the base consisting of the aforesaid metallic plate shaped body and the aluminum alloy layer covering the surface thereof is preferably coated with an insulating resin. This insulating resin prevents electrolytic corrosion reaction from occurring between the metallic plate shaped body and the aluminum alloy layer so that the corrosion of the heat sink is prevented.

BRIEF DESCRIPTION OF THE DRAWINGS

FIG. 4(a) is a partial plan view showing a fourth working example of a heat sink in accordance with the present invention, and FIG. 4(b) is a longitudinal sectional view showing the same.

FIG. 5 is a longitudinal sectional view showing a sixth working example of a heat sink in accordance with the present invention.

FIG. 6 is a longitudinal sectional view showing a conventional heat sink.

DETAILED DESCRIPTION OF THE PREFERRED EMBODIMENTS

Figure 1:
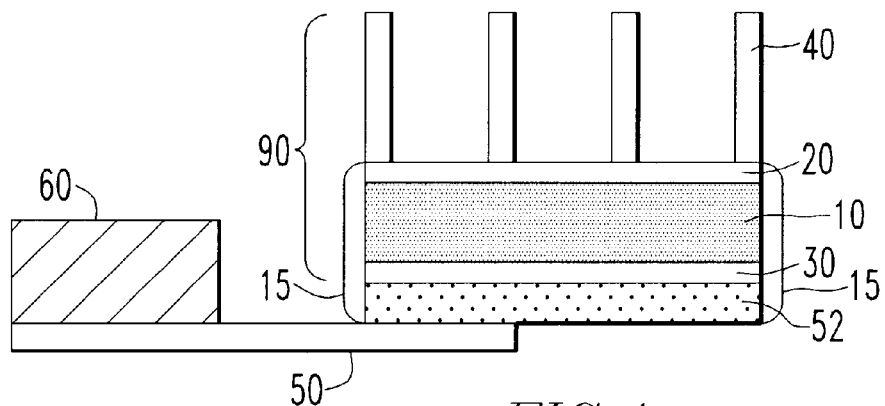
FIG. 1 is a longitudinal sectional view showing a first working example of a heat sink in accordance with the present invention.

A heat sink in accordance with the present invention uses a metallic plate shaped body having a coefficient of thermal conductivity higher than that of aluminum because it requires high thermal diffusivity. The heat sink comprises a base provided with an aluminum or aluminum alloy (hereinafter both are described as aluminum alloy) layer formed on at least one side or on both sides of the metallic plate shaped body and fins having excellent corrective heat dissipation and formed on the base. In such construction, high heat dissipation and diffusion properties can be achieved by the metallic plate shaped body having high thermal conductivity and sufficient thermal dissipation by convection to the air can be achieved by the fins. Also, a high heat transfer between the metallic plate shaped body and the fins is retained satisfactorily for a long period of time. Therefore, this heat sink has a high reliability as a heat sink.

In the present invention for the metallic plate shaped body metallic materials are used such as copper, silver, gold and the alloy thereof, etc. having a thermal conductivity higher than the coefficient of thermal conductivity (about 240 W/modeg) of aluminum alloy.

For the aluminum alloy layer, the thinner it is, the better it is, because the heat transfer of the whole heat sink decreases as the thickness of the aluminum alloy layer increases based on its low thermal conductivity. However, if the layer is too thin, in bonding of the aluminum fins, components of metallic plate shaped body different from that of aluminum alloy are diffused on the surface, so that the corrosion resistance decreases in some cases. Therefore, it is preferable that the thickness of the aluminum alloy layer be no less than 2% of the metallic plate shaped body.

Because the aluminum layer is provided on the metallic plate shaped body, the fins are preferably made of aluminum alloy. In this case, electrolytic corrosion is less likely to occur between the aluminum alloy layer and the fin thus, the corrosion resistance is high. The fins and the aluminum alloy layer are bonded to each other by soldering, brazing, diffusion bonding or welding. Soldering or brazing is preferred to welding because the bonding can be performed more easily in a large area by soldering or brazing. The methods for forming the fins on the aluminum alloy layer include: (1) a method wherein an aluminum alloy layer with a thickness of 30 to 70 mm is formed on a metallic plate shaped body and fins are fabricated by the cutting, hot forging, etc. of this layer; (2) a method wherein fins are brazed to an aluminum alloy plate, and this assembly is provided on a metallic plate shaped body; and (3) a method wherein rod-shaped fins are brazed to an aluminum alloy layer of a metallic plate shaped body.

As for the fins and aluminum alloy layer formed on the metallic plate shaped body, various types of aluminum alloys, Al—Cu clad material and composite material, etc. as well as pure aluminum and aluminum alloys specified in JIS (Japanese Industrial Standard) or ASTM (American Society for Testing Material) can be used.

As for the method for forming the aluminum alloy layer on the metallic plate shaped body, a cladding method in which a metallic plate shaped body is clad by rolling with an aluminum alloy plate is preferred because this method is high in productivity and low in cost.

In addition, a method in which an aluminum alloy is diffusion bonded or brazed to a metallic plate shaped body, a method in which vacuum deposition, sputtering, or thermal spraying of an aluminum alloy is carried out on a metallic plate shaped body, a method in which a metallic plate shaped body is immersed in molten aluminum alloy, a method in which explosion welding is carried out, etc. are used. All of these methods provide high bonding properties.

In the present invention, when the aluminum alloy layer is formed on one side only of the metallic plate shaped body, warp may occur because of the difference in coefficient of thermal expansion between the aluminum alloy layer and the metallic plate shaped body. This warp appears more remarkably as the area of heat sink increases.

This warp can be restrained by making the thickness of the aluminum alloy layer not more than 50% and preferably not more than 30% of that of the metallic plate shaped body, or by forming grooves in the aluminum alloy layer.

The aforesaid method of forming grooves is effective especially when the area of heat sink is large. The effect of the grooves is satisfactorily achieved when the depth of groove is not less than 10% of the thickness of the aluminum alloy layer. The depth of groove can be a depth such that the metallic plate shaped body is exposed, that is, 100% of the thickness of the aluminum alloy layer. The larger the number of grooves and the greater the groove width, the more remarkably the effect is achieved.

The grooves can be formed by machining using ordinary tools, carbide tools, diamond tools, etc., laser beam machining, etching, etc.

In addition, the methods of forming the grooves include a method in which small pieces of aluminum alloy plate are provided at intervals on a metallic plate shaped body, a method in which groove-shaped masks are disposed on a metallic plate shaped body and vacuum deposition, sputtering, thermal spraying, etc. are carried out over the masks, and a method in which a metallic plate shaped body on which the aforesaid groove-shaped masks are disposed is immersed in molten aluminum alloy.

The warp of the base of the heat sink can also be restrained by forming the aluminum alloy layer on both sides of the metallic plate shaped body.

In the present invention, since the fin is preferably a thin aluminum alloy plate, the following advantages can be obtained by supporting the fins with each other by support members: (1) the rigidity and strength of all the fins are increased; (2) the heat dissipating area is increased, so that the heat dissipation by convection is improved; and (3) when a heat generating part of electric and electronic component vibrates, the vibration caused by the resonance of the fins is restrained, so that the signal quality of audio equipment etc. is upgraded.

As the result of an experiment, a 5.7% increase of the aforesaid heat dissipation by convection was measured. For vibration, a waveform at 1 kHz reference wave on the output side of a transistor was measured with a fast Fourier transformer (FFT) and analyzed. As the result, it was found that the odd number of the distortion of higher harmonic wave can be reduced by 62%.

Further, it is desirable in terms of long-term endurance that a cross section exposed to the outside of the base consisting of the aforesaid metallic plate shaped body and the aluminum alloy layer covering the surface thereof be coated with an insulating resin 15. This is because this insulating resin prevents electrolytic corrosion reaction occurring between the metallic plate shaped body and the aluminum alloy layer, so that the corrosion of the aluminum alloy is prevented.

WORKING EXAMPLES

The present invention will be described in detail with reference to working examples below.

Working Example 1

FIG. 1 is a longitudinal sectional view showing a first working example of a heat sink in accordance with the present invention.

This heat sink 90 is composed of a base, in which both surfaces of a copper plate 10 have a length of 100 mm, a width of 100 mm, and a thickness of 2 mm and are clad with 0.5 mm thick aluminum alloy plates 20 and 30, and aluminum alloy fins 40, which are brazed to one aluminum alloy plate 20.

The other side of aluminum alloy plate 30 of this heat sink 90 is soldered to one end of a heat pipe 50, so that the aluminum alloy plate 30 is connected to the heat pipe 50 via a solder metal 52. The other end of the heat pipe 50 is soldered to a heat generating part 60 such as a semiconductor rectifier assembly. That is, the heat generating part 60 is thermally connected to the heat sink 90 via the heat pipe 50.

Working Example 2

Figure 2:
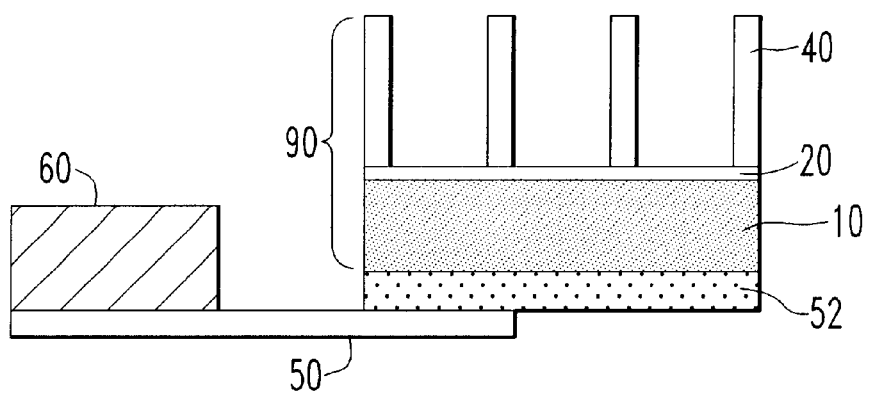
FIG. 2 is a longitudinal sectional view showing a second working example of a heat sink in accordance with the present invention.

FIG. 2 is a longitudinal sectional view showing a second working example of a heat sink in accordance with the present invention.

This heat sink 90 is composed of a base, in which one surface of a copper plate 10 has a length of 100 mm, a width of 100 mm, and a thickness of 2 mm and is clad with a 0.5 mm thick aluminum alloy plate 20, and aluminum alloy fins 40 which are brazed to the aluminum alloy plate 20. The other surface of the copper plate 10 of this heat sink 90 is thermally connected to a heat pipe 50 which is connected to a heat generating part 60 via a solder metal 52.

Working Example 3

Figure 3:
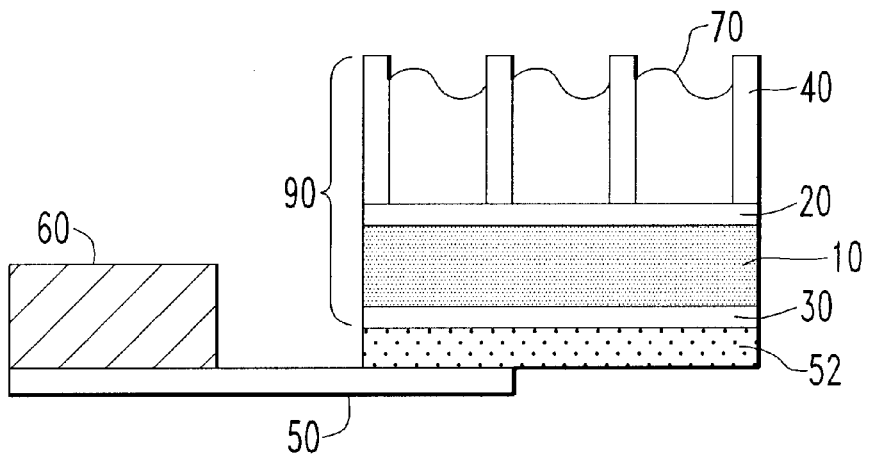
FIG. 3 is a longitudinal sectional view showing a third working example of a heat sink in accordance with the present invention.

FIG. 3 is a longitudinal sectional view showing a third working example of a heat sink in accordance with the present invention.

This heat sink 90 is configured so that support members 70 are brazed to the aluminum alloy fins 40 of the heat sink 90 shown in FIG. 1. The support member 70, which is a wave-shaped aluminum alloy sheet member, increases the heat convection properties.

Working Example 4

FIG. 4(a) is a partial plan view showing a fourth working example of a heat sink in accordance with the present invention, and FIG. 4(b) is a longitudinal sectional view showing the same.

This heat sink 90 is configured so that one surface of a copper plate 11 has a length of 200 mm, a width of 200 mm, and a thickness of 2 mm and is clad with a 0.6 mm thick aluminum alloy plate 21 and aluminum alloy fins 40 are brazed to the aluminum alloy plate 21. On the surface of this aluminum alloy plate 21 grooves 80 are formed in the longitudinal and transverse directions. The depth of the groove 80 is 70% of the thickness of the aluminum alloy plate 21.

Working Example 5

This heat sink (not shown) has the same configuration as that of the heat sink shown in FIG. 4 except that the grooves are only formed in the longitudinal direction of the aluminum alloy plate 21 of the heat sink 90 shown in FIG. 4.

Working Example 6

FIG. 5 is a longitudinal sectional view showing a sixth working example of a heat sink in accordance with the present invention.

This heat sink is configured so that support members 70 are provided on the fins 40 of the heat sink 90 shown in FIG. 4 and the other surface of the copper plate 11 is clad 15 with an aluminum alloy plate 31.

Working Example 7

This heat sink (not shown) has the same configuration as that of the heat sink shown in FIG. 4 except that no grooves are formed in the aluminum alloy plate 21 of the heat sink 90 shown in FIG. 4.

Working Example 8

This heat sink (not shown) has the same configuration as that of the heat sink shown in FIG. 4 except that the thickness of the aluminum alloy plate 21 of the heat sink 90 shown in FIG. 4 is 1.1 mm.

Each of the heat sinks in the above-mentioned working examples was connected to the heat pipe 50 which was connected to the heat generating part 60 via the soldering metal as shown in FIGS. 1–3. In this state, heating cycle tests were performed.

A heating cycle test was performed by intermittently loading electric power (voltage=80 V, current=3.01 A) on a electric heater as a heating of 2000 cycles to measure the increase percentage of thermal resistance (difference of temperature (üÄ)/thermal energy (W)) of a heat sink. The difference of temperature is the difference between the temperature of the heater and the temperature of a tip of a fin. The intermittent loading was carried out so that the temperature of the heat generating part varied between room temperature and 150 üÄ. The heat sink was placed horizontally (in such a manner that the surface of the metallic plate shaped body is horizontal), and air of 25 üÄ was blown to the fins at a velocity of 1 m/sec.

For the purpose of comparison, the same tests were performed for the case where aluminum alloy heat sink 41 are connected to a heat generating part 60 via a heat pipe 50 as shown in FIG. 6. In this figure, reference numeral 51 denotes a metallic grease.

The test results are given in Table 1.

In Table 1, the planar dimensions of heat sink are described. As seen from Table 1, the heat sinks of the present invention (No. 1 to 9) exhibited a low increase percentage of thermal resistance and good long-term heat dissipation by convection even after 2000 heat cycles. For No. 8 heat sink, of the heat sinks of the present invention, in which the thickness (1.1 mm) of the aluminum alloy plate is as thick as 55% of the thickness (2 mm) of the copper plate, the warp was slightly large though the degree thereof was such as to actually present no problem, and the increase percentage of thermal resistance somewhat increased. Therefore, the thickness of the aluminum alloy layer should be no more than 50%, preferably not more than 30%, of the thickness of the copper plate. For No. 9 heat sink, in which the aluminum alloy plate was thin, the corrosion resistance of the brazed portion somewhat decreased. However, this is not so great as to especially present an actual problem.

For Nos. 1 to 3 heat sinks, although the surface area thereof was 1/16 as compared with that of No. 11 conventional heat sink, the cooling capability per one unit was almost the same as that of the conventional heat sink, which suggests that the heat sink can be made small.

For the conventional heat sinks (Nos. 10 and 11), although the increase percentage of thermal resistance was high, the thermal contact deteriorated due to the distortion of the aluminum plate of the heat sink and the diffusion of heat was insufficient.

In the heat sinks of the present invention, no grease was interposed between the heat sink and the heat pipe, so that there is no possibility that the equipment is contaminated by the grease even if it is used in a high vacuum, and the heat dissipation by convection is not decreased by the evaporation of grease and even if the equipment is used in an open system such as outer space.

Although the heat sink of the present invention is described above as being connected to the heat generating part via the heat pipe, the same effect can be achieved by interposing a member other than the heat pipe or by directly connecting the heat generating part to the heat sink. Also, although one heat generating part is described above as being connected, the same effect can be achieved in the case where plural heat generating parts are connected.

As described above, because the heat sink of the present invention is so configured that fins are formed on the aluminum alloy layer provided on the metallic plate shaped body, the thermal resistance between the metallic plate shaped body and the fins is low, and excellent heat dissipation can be achieved stably for a long period of time.

Also, the excellent heat dissipation can make the heat sink small-sized. Further, when fins made of an aluminum alloy are used, electrolytic corrosion etc. is less likely to occur, so that the corrosion resistance is high. The warp produced when the aluminum alloy layer is only formed on one side can be restrained by forming a thin aluminum alloy layer with a thickness not higher than a predetermined value or by forming grooves in the aluminum alloy layer. The support members provided between the fins can increase the strength and heat convection characteristics of the fins.

Accordingly, the heat sink of the present invention achieves remarkable effects in cooling electric and electronic equipment and components such as motors for electric vehicles, its control circuits therefor, internal combustion engines, general power control units, general motors and general semiconductor devices.

TABLE 1

| Classification | No. | Drawing No. | Dimensions(1) mm | Planar Dimensions | Fin Bonding | Grooves | Fin Support | Increase of thermal resistance [%] (n = 5) | Remarks |
|---|---|---|---|---|---|---|---|---|---|
| Heat sink of this invention | 1 | 1 | 0.5/0.2/0.5 | 100 mm × 100 mm | Brazing | None | None | 0.3~0.5 | |
| | 2 | 2 | 0.3/2/— | | Brazing | None | None | 0.1~0.2 | |
| | 3 | 3 | 0.5/2/0.5 | | Brazing | None | Yes | 0.2~0.4 | |
| | 4 | 4 | 0.6/2/— | 200 mm × 200 mm | Brazing | Intersecting grooves | None | 0.3~0.5 | |
| | 5 | — | 0.6/2/— | | Brazing | Longitudinal grooves | None | 0.4~0.6 | |
| | 6 | 5 | 0.6/2/0.6 | | Brazing | Intersecting grooves | Yes | 0.2~0.4 | |
| | 7 | — | 0.6/2/— | | Brazing | None | None | 0.4~0.6 | |
| | 8 | 4 | 1.1/2/— | | Brazing | None | None | 0.5~0.7 | 2 |
| | 9 | 6 | 0.03/2/— | | Brazing | None | None | 0.3~0.5 | 3 |
| Conventional heat sink | 10 | 6 | —/—/— | | | None | None | 5~11 | |
| | 11 | 6 | —/—/— | 4 | Screwing | None | None | 3~6 | |

Note:
1 Thickness of alummum alloy layer of one side/thickness of metallic plate shaped body/thickness of aluminum alloy layer of the other side (mm)
2 Warp is slighly large.
3 Corrosion resistance at brazed portion decreases.
4 400 mm × 400 mm

We claim:

1. A heat sink comprising a base being composed of a metallic plate shaped body comprising copper, silver, gold, or alloys thereof, and having a coefficient of thermal conductivity higher than that of aluminum and of a layer of aluminum or aluminum alloy bonded on both sides of said metallic plate shaped body with a metallic bond, and fins for heat dissipation, which fins are bonded with a metallic bond to one of said layers of aluminum or aluminum alloy.

2. A heat sink according to claim 1, wherein the metallic bond between the metallic plate shaped body and the layer of aluminum or aluminum alloy, is formed by brazing.

3. A heat sink according to claim 1, wherein the metallic bond between the metallic plate shaped body and the layer of aluminum or aluminum alloy, is formed by soldering.

4. A heat sink according to claim 1, wherein the metallic bond between the metallic plate shaped body and the layer of aluminum or aluminum alloy, is a diffusion bond.

5. A heat sink according to claim 1, wherein the metallic bond between the metallic plate shaped body and the layer of aluminum or aluminum alloy, is a weld.

6. A heat sink according to claim 1, wherein the metallic bond between the metallic plate shaped body and the layer of aluminum or aluminum alloy, is made by roll cladding.

7. A heat sink according to claim 1, wherein the metallic bond between the layer of aluminum or aluminum alloy and the fins for heat dissipation, is formed by brazing.

8. A heat sink according to claim 1, wherein the metallic bond between the layer of aluminum or aluminum alloy and the fins for heat dissipation, is formed by soldering.

9. A heat sink according to claim 1, wherein the metallic bond between the layer of aluminum or aluminum alloy and the fins for heat dissipation, is a diffusion bond.

10. A heat sink according to claim 1, wherein the metallic bond between the layer of aluminum or aluminum alloy and the fins for heat dissipation, is a weld.

11. A heat sink according to claim 1, wherein the thickness of said layer of aluminum or aluminum alloy is 2 to 50% of the thickness of said metallic plate shaped body.

12. A heat sink according to claim 1, wherein grooves are formed on the side of said layer of aluminum or aluminum alloy having fins for heat dissipation.

13. A heat sink according to claim 1, wherein support members for supporting said fins for heat dissipation with each other are provided among said fins.

14. A heat sink according to claim 1, wherein a cross section exposed to the outside of the base comprising said metallic plate shaped body and said layer of aluminum or aluminum alloy covering the surface thereof includes a coating of an insulating resin.

15. A heat sink according to claim 1, wherein said metallic plate shaped body having a coefficient of thermal conductivity higher than that of aluminum is a plate shaped body made of copper or copper alloy.

16. A heat sink according to claim 1, wherein grooves are formed on a surface of said layer of aluminum or aluminum alloy in the longitudinal direction thereof.

17. A heat sink according to claim 1, wherein grooves are formed on a surface of said layer of aluminum or aluminum alloy in the longitudinal and transverse directions thereof.

* * * * *